(12) United States Patent

Meng et al.

(10) Patent No.: US 12,690,302 B2

(45) Date of Patent: Jul. 21, 2026

(54) LIGHT-EMITTING DEVICE AND LIGHT-EMITTING APPARATUS

(71) Applicant: TIANJIN SANAN OPTOELECTRONICS CO., LTD., Tianjin (CN)

(72) Inventors: Cheng Meng, Tianjin (CN); Dongmei Cao, Tianjin (CN); Weihuan Li, Tianjin (CN); Huan-Shao Kuo, Tianjin (CN); Yu-Ren Peng, Tianjin (CN); Duxiang Wang, Tianjin (CN)

(73) Assignee: TIANJIN SANAN OPTOELECTRONICS CO., LTD., Tianjin (CN)

( * ) Notice: Subject to any disclaimer, the term of this patent is extended or adjusted under 35 U.S.C. 154(b) by 398 days.

(21) Appl. No.: 18/394,674

(22) Filed: Dec. 22, 2023

(65) Prior Publication Data

US 2024/0213412 A1      Jun. 27, 2024

(30) Foreign Application Priority Data

Dec. 23, 2022      (CN) .......................... 202211660452.3

(51) Int. Cl.
*H10H 20/833*      (2025.01)
*H10H 20/814*      (2025.01)
(Continued)

(52) U.S. Cl.
CPC ........ *H10H 20/833* (2025.01); *H10H 20/814* (2025.01); *H10H 20/831* (2025.01); *H10H 20/8312* (2025.01); *H10H 20/835* (2025.01)

(58) Field of Classification Search
CPC .. H10H 20/833; H10H 20/814; H10H 20/831; H10H 20/8312; H10H 20/835
See application file for complete search history.

(56) References Cited

U.S. PATENT DOCUMENTS 8,378,376 B2 * 2/2013 Chung ................ H10H 20/835
257/E33.07
9,472,719 B2 * 10/2016 Peng .................... H10H 20/831
(Continued)

FOREIGN PATENT DOCUMENTS

CN      108878614 A * 11/2018   ............. H10H 20/01
CN      114503292 A * 5/2022    ............ H10W 90/00
(Continued)

*Primary Examiner* — Scott B Geyer
(74) *Attorney, Agent, or Firm* — MUNCY, GEISSLER, OLDS & LOWE, P.C.

(57) ABSTRACT

A light-emitting device includes a semiconductor epitaxial structure that has a first surface and a second surface opposite to the first surface, and that includes a first type semiconductor layer, an active layer, and a second type semiconductor layer sequentially disposed in such order in a thickness direction from the first surface to the second surface. An ohmic contact layer is disposed on the second surface of the semiconductor epitaxial structure, and a light-transmissive dielectric layer is disposed on the ohmic contact layer away from the semiconductor epitaxial structure. The light-transmissive dielectric layer has a plurality of through holes. A reflection layer is disposed on the light-transmissive dielectric layer and fills the through holes so as to be electrically connected to the ohmic contact layer.

17 Claims, 6 Drawing Sheets

(51) Int. Cl.
    H10H 20/831        (2025.01)
    H10H 20/832        (2025.01)

(56)               References Cited

U.S. PATENT DOCUMENTS

| | | | | |
|---|---|---|---|---|
| 2005/0087884 | A1* | 4/2005 | Stokes | H10H 20/835 |
| | | | | 257/E33.068 |
| 2008/0173885 | A1* | 7/2008 | Kuromizu | H10H 20/835 |
| | | | | 257/E33.068 |
| 2008/0277681 | A1* | 11/2008 | Xu | H10H 20/814 |
| | | | | 257/E33.064 |
| 2012/0043566 | A1* | 2/2012 | Wu | H10H 20/835 |
| | | | | 257/E33.072 |
| 2016/0118540 | A1* | 4/2016 | Dong | H10H 20/812 |
| | | | | 257/13 |
| 2016/0240731 | A1* | 8/2016 | Peng | H10H 20/831 |
| 2017/0309786 | A1* | 10/2017 | Meng | H10H 20/841 |
| 2018/0076361 | A1* | 3/2018 | Wang | H10H 20/821 |
| 2019/0067511 | A1* | 2/2019 | Totani | H10H 20/857 |
| 2021/0043798 | A1* | 2/2021 | Zhang | H10H 20/835 |
| 2021/0226095 | A1* | 7/2021 | Wang | H10H 20/824 |
| 2022/0077370 | A1* | 3/2022 | Zhang | H10H 20/857 |
| 2023/0402572 | A1* | 12/2023 | Jia | H10H 20/835 |
| 2024/0154068 | A1* | 5/2024 | Jia | H10H 20/831 |

FOREIGN PATENT DOCUMENTS

| | | | | |
|---|---|---|---|---|
| CN | 116995173 A | * | 11/2023 | H10H 20/82 |
| JP | 2011040739 A | * | 2/2011 | H10H 20/835 |
| KR | 20160124050 A | * | 10/2016 | H10H 20/833 |

* cited by examiner

LIGHT-EMITTING DEVICE AND LIGHT-EMITTING APPARATUS

CROSS-REFERENCE TO RELATED APPLICATION

This application claims priority to Chinese Invention Patent Application No. 202211660452.3, filed on Dec. 23, 2022, the entire disclosure of which is incorporated by reference herein.

FIELD

The disclosure relates to a light-emitting device and a light-emitting apparatus.

BACKGROUND

Light-emitting devices (LEDs) have advantages of high luminous brightness, high efficiency, small size, long lifespan, etc., and are considered to be one of the light sources having the most potential. In recent years, LEDs have been widely used in daily life, such as illumination, signal display, backlight, vehicle lamps, and large screen display. These applications ask for a higher level of luminous brightness and efficiency of the LEDs.

A vertical type light-emitting device is manufactured by transferring a semiconductor epitaxial structure from a growth substrate onto a supporting substrate, which may be made of silicon, silicon carbide, or metal, and then removing the growth substrate. Technical problems such as light absorption, current crowding, or poor heat dissipation caused by the growth substrate may thereby be effectively mitigated. A bonding process, such as metal-metal bonding under high temperature and high pressure, is conducted to transfer the semiconductor epitaxial structure. That is to say, a metal bonding layer is formed between a side of the semiconductor epitaxial structure and the supporting substrate. Another side of the semiconductor epitaxial structure is a light exiting side. A wire bonding electrode is disposed on the light exiting side for injection or outflow of current, and the supporting substrate is for injection or outflow of the current. Thus, the light-emitting device having the current flowing vertically through the semiconductor epitaxial structure is manufactured.

To improve the luminous efficiency, a metal reflection layer and a light-transmissive dielectric layer are disposed on a side of the metal bonding layer and cooperatively form an omnidirectional reflector (ODR) structure, which reflects light from the metal bonding layer to the light exiting side, thereby improving the luminous efficiency. If the light-transmissive dielectric layer is disposed on and completely covers a second type semiconductor layer of the semiconductor epitaxial structure away from an active layer, the second type semiconductor layer may not be electrically connected to, e.g., an ohmic contact layer. A common approach is to form conductive via(s) in the light-transmissive dielectric layer so as to form electrical connection. The conductive via(s) of the light-transmissive dielectric layer may have cross section(s) that is(are) circular in shape. The more the conductive via(s) of the light-transmissive dielectric layer there is(are), the larger a contact area between the ohmic contact layer and the second type semiconductor layer is, thereby facilitating current spreading and lowering voltage. However, an ODR mirror area is reduced, and the luminous brightness of the light-emitting device may be decreased. Conversely, the fewer the conductive via(s) of the light-transmissive dielectric layer there is(are), the smaller the contact area between the ohmic contact layer and the second type semiconductor layer is. Thus, current spreading is limited, and the voltage is increased. However, the ODR mirror area is increased, and reflection efficiency of the ODR structure is improved, thereby increasing the luminous brightness of the light-emitting device. Improving the luminous efficiency while lowering voltage is thus a problem to be resolved.

SUMMARY

Therefore, an object of the disclosure is to provide a light-emitting device and a light-emitting apparatus that can alleviate at least one of the drawbacks of the prior art.

According to one aspect of the disclosure, the light-emitting device includes a semiconductor epitaxial structure that has a first surface and a second surface opposite to the first surface, and that includes a first type semiconductor layer, an active layer, and a second type semiconductor layer sequentially disposed in such order in a thickness direction from the first surface to the second surface. The first surface is a light exiting surface.

An ohmic contact layer is disposed on the second surface of the semiconductor epitaxial structure.

A light-transmissive dielectric layer is disposed on the ohmic contact layer away from the semiconductor epitaxial structure, and has a plurality of through holes. Each of the through holes has an opening that faces the ohmic contact layer.

A reflection layer is disposed on the light-transmissive dielectric layer and fills the through holes so as to be electrically connected to the ohmic contact layer.

The ohmic contact layer has a first contacting surface that faces the openings of the through holes, and a second contacting surface that contacts the second surface. An area of the first contacting surface of the ohmic contact layer is greater than a total area of the openings of the through holes. An area of the second contacting surface of the ohmic contact layer accounts for 2% to 60% of an area of the second surface.

According to another aspect of the disclosure, a light-emitting apparatus includes the aforesaid light-emitting device.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

US 12,690,302 B2

3

Figure 9:
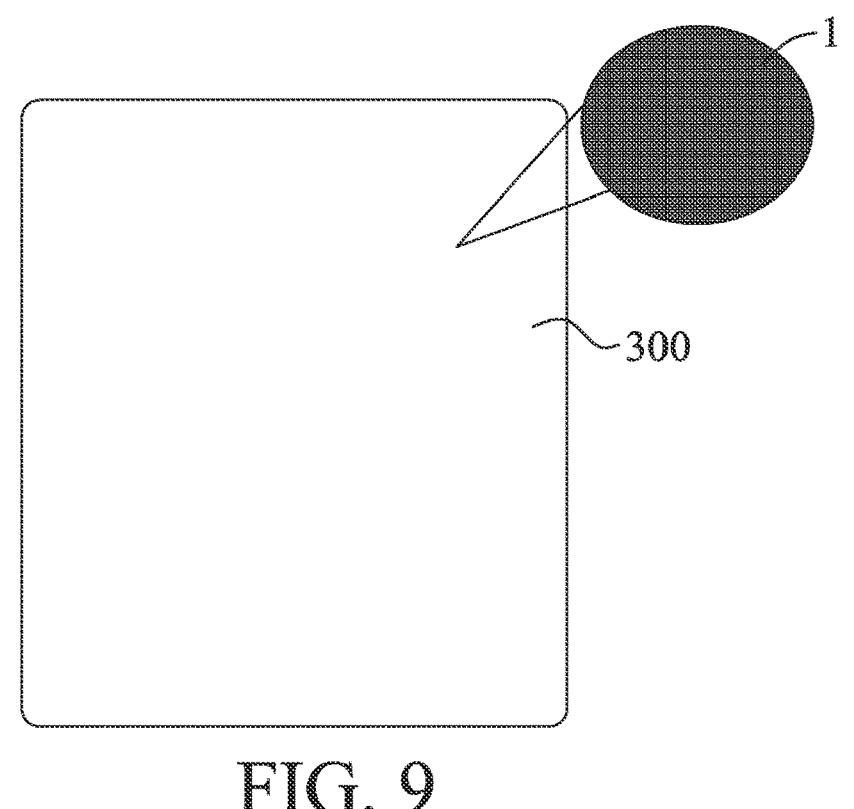

FIG. 9 is a schematic view illustrating an embodiment of a light-emitting apparatus according to the disclosure.

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 1:
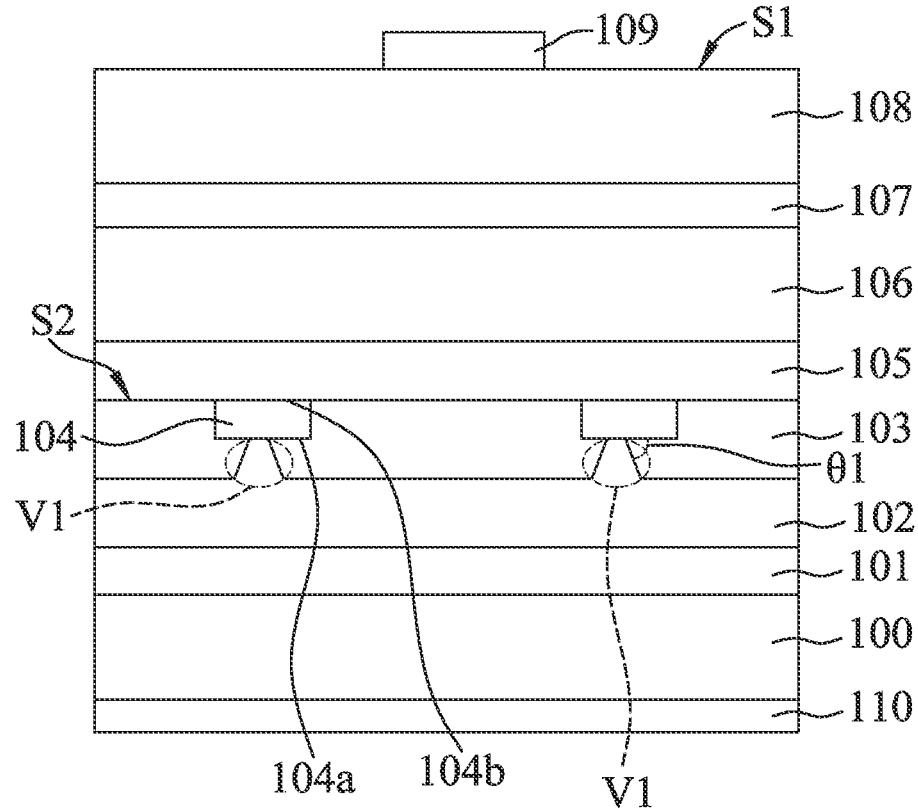
FIG. 1 is a schematic view illustrating a first embodiment of a light-emitting device according to the disclosure.

Referring to FIG. 1, a first embodiment of a light-emitting device according to the disclosure includes a semiconductor epitaxial structure that has a first surface (S1) and a second surface (S2) opposite to the first surface (S1), and includes a first type semiconductor layer 108, an active layer 107, and a second type semiconductor layer 106 sequentially disposed in such order in a thickness direction from the first surface (S1) to the second surface (S2). The first surface (S1) is a light exiting surface. The light-emitting device further includes a supporting substrate 100, a metal bonding layer 101, a reflection layer 102, a light-transmissive dielectric layer 103, an ohmic contact layer 104, a first electrode 109, and a second electrode 110.

The supporting substrate 100 is a conductive substrate, such as a silicon substrate, a silicon carbide substrate, or a metal substrate. The metal substrate may be a copper substrate, a tungsten substrate, a copper tungsten substrate, a molybdenum substrate, etc. The supporting substrate 100 may have a thickness no smaller than 50 μm so as to have sufficient mechanical strength to support the semiconductor epitaxial structure. Furthermore, in other embodiments, in order to facilitate mechanical processing of the supporting substrate 100 after bonding the supporting substrate 100 to the semiconductor epitaxial structure, the thickness of the supporting substrate 100 is no greater than 300 μm. In this embodiment, the supporting substrate 100 is a silicon substrate or a copper tungsten substrate.

The semiconductor epitaxial structure has the first surface (S1), the second surface (S2) opposite to the first surface (S1), and a side surface connecting the first surface (S1) and the second surface (S2). The semiconductor epitaxial structure is obtained by metal-organic chemical vapor deposition (MOCVD) or other growth methods. The semiconductor epitaxial structure may contain a semiconductor material that generates light, such as ultra-violet light, blue light, green light, yellow light, red light, and infrared light. The semiconductor material of the semiconductor epitaxial structure may be a material that generates light with a wavelength ranging from 200 nm to 950 nm, such as a nitride material. In some embodiments, the semiconductor epitaxial structure may be a GaN-based semiconductor epitaxial structure which may be doped with elements such as aluminum and indium, and which generates light having a wavelength ranging from 200 nm to 550 nm. In other embodiments, the semiconductor epitaxial structure is an AlGaInP-based semiconductor epitaxial structure or an AlGaAs-based semiconductor epitaxial structure that generates a light having a wavelength ranging from 550 nm to 950 nm.

The first type semiconductor layer 108 and the second type semiconductor layer 106 may be respectively an n-type doped semiconductor layer or a p-type doped semiconductor layer to provide electrons and holes, respectively. The n-type semiconductor layer may be doped with an n-type dopant such as Si, Ge, or Sn, and the p-type semiconductor layer may be doped with a p-type dopant such as Mg, Zn, Ca, Sr, or Ba. Each of the first type semiconductor layer 108, the active layer 107, and the second type semiconductor layer 106 may be made of a material such as AlGaInN, GaN, AlGaN, AlInP, AlGaInP, GaAs or AlGaAs. The active layer 107 is a region for the electrons and the holes to recombine. The active layer 107 may be made of various materials depending on a desired wavelength of light to be emitted by the active layer 107, and may have a single quantum well structure or a multiple quantum well structure. By adjusting a ratio of elements in the semiconductor material of the active layer 107, the active layer 107 may emit light with a desired wavelength. In this embodiment, the semiconductor epitaxial structure is made of an AlGaInP-based material or a GaAs-based material.

In order to improve current spreading of the light-emitting device, the semiconductor epitaxial structure further includes the current spreading layer 105 disposed on the second type semiconductor layer 106. A material of the current spreading layer 105 may be GaP, AlGaAs, AlGaInP, and etc. In this embodiment, the current spreading layer 105 is made of GaP, and has a thickness ranging from 0.02 μm to 1.5 μm. In certain embodiments, the thickness of the current spreading layer 105 ranges from 0.02 μm to 0.8 μm. The current spreading layer 105 has a doping concentration ranging from 5E17/cm³ to 5E18/cm³.

The metal bonding layer 101 may be made of a metallic material, such as gold, tin, titanium, tungsten, nickel, platinum, indium, or combinations thereof, is used to bond the semiconductor epitaxial structure to the supporting substrate 100, and may have a single-layered structure or a multilayered structure.

The reflection layer 102 is disposed on the metal bonding layer 101 and is closer to the semiconductor epitaxial structure than the metal bonding layer 101. The reflection layer 102 has a reflectivity no smaller than 70%. The reflection layer 102 includes a material such as, Ag, Ni, Al, Rh, Pd, Ir, Ru, Mg, Ti, Cr, Zn, Pt, Au, Hf or combinations thereof. In this embodiment, the reflection layer 102 is made of Au or Ag. The reflection layer 102 may reflect light radiated by the semiconductor epitaxial structure towards the supporting substrate 100 back to the semiconductor epitaxial structure, and then emit the light outwardly from the first surface (S1), i.e., a light exiting surface. In this embodiment, the first surface (S1), i.e., the light exiting surface, of the light-emitting device is a surface of the first type semiconductor layer 108 away from the active layer 107.

The light-transmissive dielectric layer 103 is disposed on the current spreading layer 105 away from the active layer 107 and between the semiconductor epitaxial structure and the reflective layer 102. The light-transmissive dielectric layer 103 has a plurality of through holes (V1) penetrating through the light-transmissive dielectric layer 103. The reflection layer 102 is disposed on the light-transmissive dielectric layer 103 away from the semiconductor epitaxial structure and fills the through holes (V1) so as to be electrically connected to the current spreading layer 105.

Each of the through holes (V1) of the light-transmissive dielectric layer 103 is defined by a hole-defining surface of the light-transmissive dielectric layer (103), and has an opening that faces the ohmic contact layer 104. The hole-defining surface defining each of the through holes (V1) is oblique, and forms an included angle ($\theta_1$) with an imaginary plane perpendicular to the thickness direction. In this embodiment, the included angle ($\theta1$) ranges from 20° to 80°.

In certain embodiments, the included angle ($\theta1$) ranges from 30° to 70°, and in some other embodiments, the included angle ($\theta1$) ranges from 40° to 60°. The hole-defining surface of the light-transmissive dielectric layer 103, which defines each of the through holes (V1), is oblique, thereby enabling the reflection layer 102 to better cover the hole-defining surface. Meanwhile, the oblique hole-defining surfaces may reflect the light radiated by the semiconductor epitaxial structure to the light exiting surface to emit the light outwardly.

The light-transmissive dielectric layer 103 includes fluoride, oxide, nitride or combinations thereof, such as ZnO, $SiO_2$, $SiO_x$, $SiO_xN_y$, $Si_3N_4$, $Al_2O_3$, $TiO_x$, MgF, GaF or combinations thereof. The light-transmissive dielectric layer 103 is adapted to reflect the light radiated from the active layer 107 back to the semiconductor epitaxial structure or a side surface of the semiconductor epitaxial structure. Therefore, the light-transmissive dielectric layer 103 directly contacting the semiconductor epitaxial structure may be made of a low refractive index material, such as silicon oxide, to increase reflection of the light that passes through the semiconductor epitaxial structure to a surface of the light-transmissive dielectric layer 103. In some embodiments, the light-transmissive dielectric layer 103 has a refractive index (n1) no greater than 1.5, and the refractive index (n1) of the light-transmissive dielectric layer 103 is smaller than a refractive index (n0) of the second type semiconductor layer 106, i.e., n0>n1. The light-transmissive dielectric layer 103 has a thickness greater than 1000 Å (i.e., 100 nm), such as ranging from 100 nm to 1000 nm. In certain embodiments, the thickness of the light-transmissive dielectric layer 103 ranges from 100 nm to 900 nm, and in another embodiment, the thickness of the light-transmissive dielectric layer 103 ranges from 300 nm to 900 nm. The light-transmissive dielectric layer 103 has a light transmittance no smaller than 70%. In certain embodiments, the light transmittance is no smaller than 80%, and in another embodiment, the light transmittance is no smaller than 90%.

In certain embodiments, the light-transmissive dielectric layer 103 has a single-layered structure or a multi-layered structure. Multiple layers of the multi-layered structure may be made of different materials, or may be made by alternatively stacking two materials having different refractive indices. The material for the light-transmissive dielectric layer 103 is as mentioned above. In some embodiments, an optical thickness of the light-transmissive dielectric layer 103 is an integer multiple of one-quarter of a light-emitting wavelength of the light. The light-transmissive dielectric layer 103 has the plurality of through holes (V1) (as shown in FIG. 1). A cross-section in a horizontal direction (i.e., perpendicular to the thickness direction) of each of the through holes (V1) may have a circular shape, an elliptical shape, or a polygonal shape, and a maximum width of each of the through holes (V1) ranges from 2 μm to 10 μm. In certain embodiments, the maximum width ranges from 2 μm to 6 μm. By reducing the maximum width of each of the through holes (V1) of the light-transmissive dielectric layer 103, an area of an omni-directional reflector (ODR) structure (composed of the reflection layer 102 and the light-transmissive dielectric layer 103) may be increased, thereby increasing light-emitting efficiency of the light-emitting device.

As mentioned above, the reflection layer 102 and the light-transmissive dielectric layer 103 cooperatively form the omni-directional reflector (ODR) structure to reflect the light emitted by the semiconductor epitaxial structure towards the supporting substrate 100 back to the semiconductor epitaxial structure, and then the light radiate outwardly from the light exiting surface to improve the light-emitting efficiency.

The ohmic contact layer 104 is disposed between the semiconductor epitaxial structure and the light-transmissive dielectric layer 103, and has a first contacting surface 104a that faces the openings of the through holes (V1), and a second contacting surface 104b that contacts the second surface (S2). The ohmic contact layer 104 is disposed on the current spreading layer 105 and forms an ohmic contact with the current spreading layer 105. The through holes (V1) of the light-transmissive dielectric layer 103 are formed in the ohmic contact layer 104. The reflection layer 102 fills the through holes (V1), so as to be electrically connected to the ohmic contact layer 104.

In some embodiments, the ohmic contact layer 104 has a patterned structure. The ohmic contact layer 104 may have a regular pattern or an irregular pattern, thereby reducing light absorption of the ohmic contact layer 104. The ohmic contact layer 104 is a transparent conductive layer. The ohmic contact layer 104 includes ZnO, $In_2O_3$, $SnO_2$, ITO (Indium Tin Oxide), IZO (Indium Zinc Oxide), GZO (Gallium-doped Zinc Oxide) or combinations thereof. In this embodiment, the ohmic contact layer 104 is made of ITO. The light-transmissive dielectric layer 103 covers a part of the first contacting surface 104a of the ohmic contact layer 104 and a side surface of the ohmic contact layer 104, as shown in FIG. 1.

An area of the first contacting surface 104a of the ohmic contact layer 104 is greater than a total area of the openings of the through holes (V1). An area of the second contacting surface 104b of the ohmic contact layer 104 accounts for 2% to 60% of an area of the second surface (S2). In certain embodiments, the area of the second contacting surface 104b of the ohmic contact layer 104 accounts for 4% to 40% of the area of the second surface (S2), and in other embodiments, the area of the second contacting surface 104b of the ohmic contact layer 104 accounts for 10% to 30% of the area of the second surface (S2). By virtue of a ratio of the area of the second contacting surface 104b of the ohmic contact layer 104 to the area of the second surface (S2) being within the above-mentioned range, a sufficient ohmic contact area, uniform current spreading in the current spreading layer 105, and a lower voltage of the light-emitting device are ensured. Meanwhile, the light-transmissive dielectric layer 103 forms the plurality of through holes (V1). The reflection layer 102 fills the through holes (V1) and is in contact with the ohmic contact layer 104, so as to achieve current conducting and spreading in the light-emitting device. The area of the first contacting surface 104a of the ohmic contact layer 104 is greater than the total area of the openings of the through holes (V1) of the light-transmissive dielectric layer 103, so that a mirror reflection area may be maximized when the voltage of the light-emitting device is lower, thereby improving luminous brightness and efficiency of the light-emitting device.

The first electrode 109 is disposed on the light exiting surface (i.e., the first surface (S1)) of the semiconductor epitaxial structure. In some embodiments, the first electrode 109 includes a pad electrode and an extension electrode (not shown), where the pad electrode is used for external wiring while packaging. The pad electrode may be designed to have different shapes, such as a cylindrical shape, a block shape or other polygonal shapes, depending on actual requirements. The extension electrode may be formed according to a predetermined pattern, and may have various shapes such as a strip.

The light-emitting device further includes the second electrode 110. In this embodiment, the second electrode 110 is disposed on and completely covers the supporting substrate 100 opposite to the semiconductor epitaxial structure. In the present embodiment, the supporting substrate 100 is a conductive supporting substrate, and the first electrode 109 and the second electrode 110 are respectively disposed on opposite sides of the supporting substrate 100 so as to achieve vertical flow of current through the semiconductor epitaxial structure and provide a uniform current density. In certain embodiments, each of the first electrode 109 and the second electrode 110 is made of a metallic material.

In the present embodiment, by virtue of an optimized design of the ohmic contact layer 104 and the ODR mirror structure, the mirror reflection area is maximized when the light-emitting device has a lower voltage, thereby improving the luminous brightness and efficiency of the light-emitting device.

Figure 2:
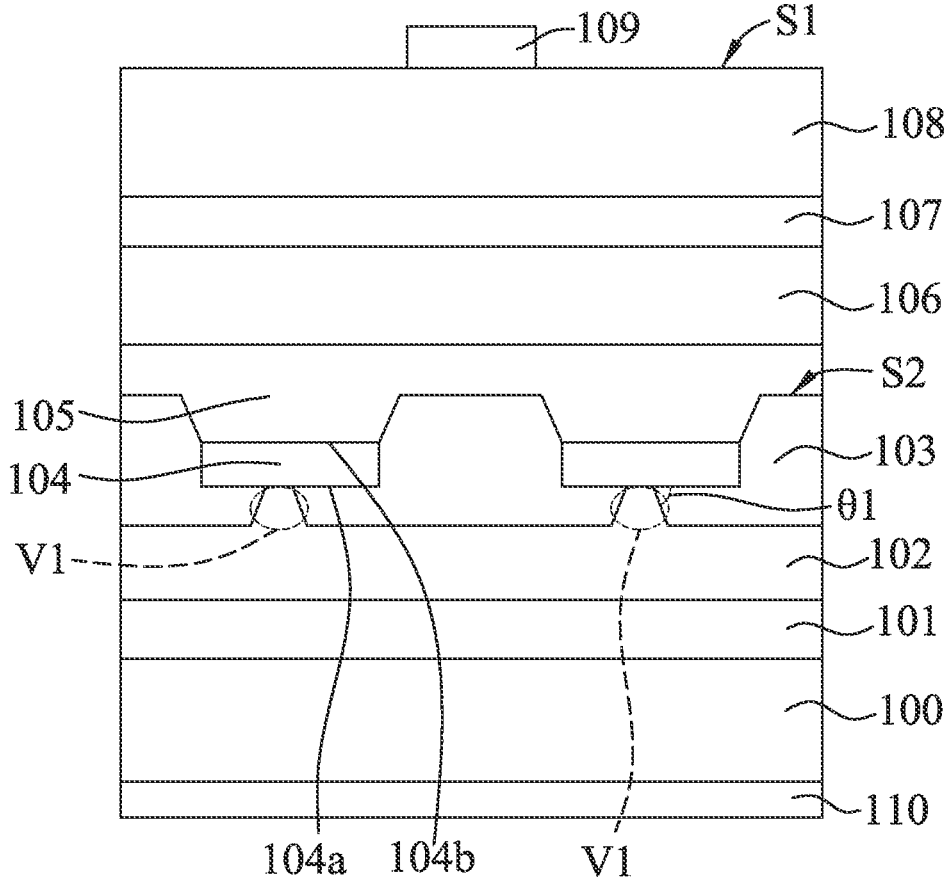
FIG. 2 is a schematic view illustrating a second embodiment of the light-emitting device according to the disclosure.

FIG. 2 is a schematic view of a second embodiment of the light-emitting device of the present disclosure. The second embodiment has a structure similar to that of the first embodiment, and the differences are described below. In this embodiment, the current spreading layer 105 has a recess region and a non-recess region, and thus has an uneven surface away from the first surface (S1). The non-recess region of the current spreading layer 105 has a thickness greater than a thickness of the recess region of the current spreading layer 105. The current spreading layer 105 may include a plurality of the non-recess regions which are independent from each other; the recess region may surround the non-recess regions. A surface of each of the non-recess regions which contacts the second contacting surface 104b of the ohmic contact layer 104 has a shape, and the shape may be circular, semicircular, triangular, pentagonal, hexagonal, etc. Alternatively, the current spreading layer 105 may include a plurality of the recess regions which are separated from each other; the non-recess region may surround the recess regions. A surface of each of the recess regions facing the light-transmissive dielectric layer 103 has a shape, and the shape may be circular, semicircular, triangular, pentagonal, hexagonal, etc.

In certain embodiments, the recess region(s) may penetrate the current spreading layer 105, which means part(s) of the current spreading layer 105 is(are) removed along a direction from the light-transmissive dielectric layer 103 to the first surface (S1) (i.e., the thickness direction). In other embodiments, the recess region(s) may not completely penetrate the current spreading layer 105, as shown in FIG. 2, i.e., the recess region of the current spreading layer 105 is thinned along the thickness direction. Thinning or removal of parts of the current spreading layer 105 may be implemented by a conventional process such as dry etching. In some embodiments, the recess region of the current spreading layer 105 does not penetrate the current spreading layer 105, and the thickness of the recess region is greater than 0 and not greater than the thickness of the non-recess region. Due to light absorption of the current spreading layer 105, the recess region of the current spreading layer 105 may control flowing direction of current and reduce light absorption of the current spreading layer 105, thereby enhancing the luminous brightness of the light-emitting device.

Referring to FIG. 2, the light-transmissive dielectric layer 103 is disposed between the current spreading layer 105 and the reflection layer 102. The reflection layer 102 is disposed on the light-transmissive dielectric layer 103 away from the semiconductor epitaxial structure. The ohmic contact layer 104 is disposed on the non-recess regions of the current spreading layer 105. In this embodiment, an area of the second contacting surface 104b of the ohmic contact layer 104 to which the non-recess regions are connected is equal to a total area of surfaces of the non-recess regions which contact the second contacting surface 104b of the ohmic contact layer 104.

The ohmic contact layer 104 has the patterned structure to thereby reduce the light absorption of the ohmic contact layer 104. The ohmic contact layer 104 is a transparent conductive layer and may be made of ITO or IZO. In this embodiment, the ohmic contact layer 104 is made of ITO. The light-transmissive dielectric layer 103 covers a part of the first contacting surface 104a of the ohmic contact layer 104 and a side surface of the ohmic contact layer 104. In this embodiment, the light-transmissive dielectric layer 103 is also disposed on and in contact with the current spreading layer 105. The area of the first contacting surface 104a of the ohmic contact layer 104 is greater than the total area of the openings of the through holes (V1) of the light-transmissive dielectric layer 103. In certain embodiments, the area of the second contacting surface 104b of the ohmic contact layer 104 accounts for 2% to 60% of the area of the second surface (S2). In some embodiments, the area of the second contacting surface 104b of the ohmic contact layer 104 accounts for 4% to 60% of the area of the second surface (S2), and in other embodiments, the area of the second contacting surface 104b of the ohmic contact layer 104 accounts for 10% to 30% of the area of the second surface (S2). By virtue of the above-mentioned ratio of the area of the second contacting surface 104b of the ohmic contact layer 104 to the area of the second surface (S2) being within the above-mentioned range, the sufficient ohmic contact area, uniform current spreading in the current spreading layer 105, and the lower voltage of the light-emitting device are ensured. At the same time, the mirror area is maximized, thereby improving the luminous efficiency and the luminous brightness of the light-emitting device.

By virtue of the design of the recess region and the non-recess region of the current spreading layer 105, the light absorption of the current spreading layer 105 is reduced, the flowing direction of the current is controlled, and the mirror reflection area is increased, thereby improving the luminous efficiency and luminous brightness of the light-emitting device. In this embodiment, the area of the first contacting surface 104a of the ohmic contact layer 104 is greater than the total area of the openings of the through holes (V1) of the light-transmissive dielectric layer 103. By virtue of the above-mentioned ratio of the area of the first contacting surface 104a of the ohmic contact layer 104 to the total area of the openings of the through holes (V1), the mirror reflection area is maximized and the lower voltage of the light-emitting device is ensured, thereby improving the luminous efficiency and the luminous brightness of the light-emitting device.

Figure 3:
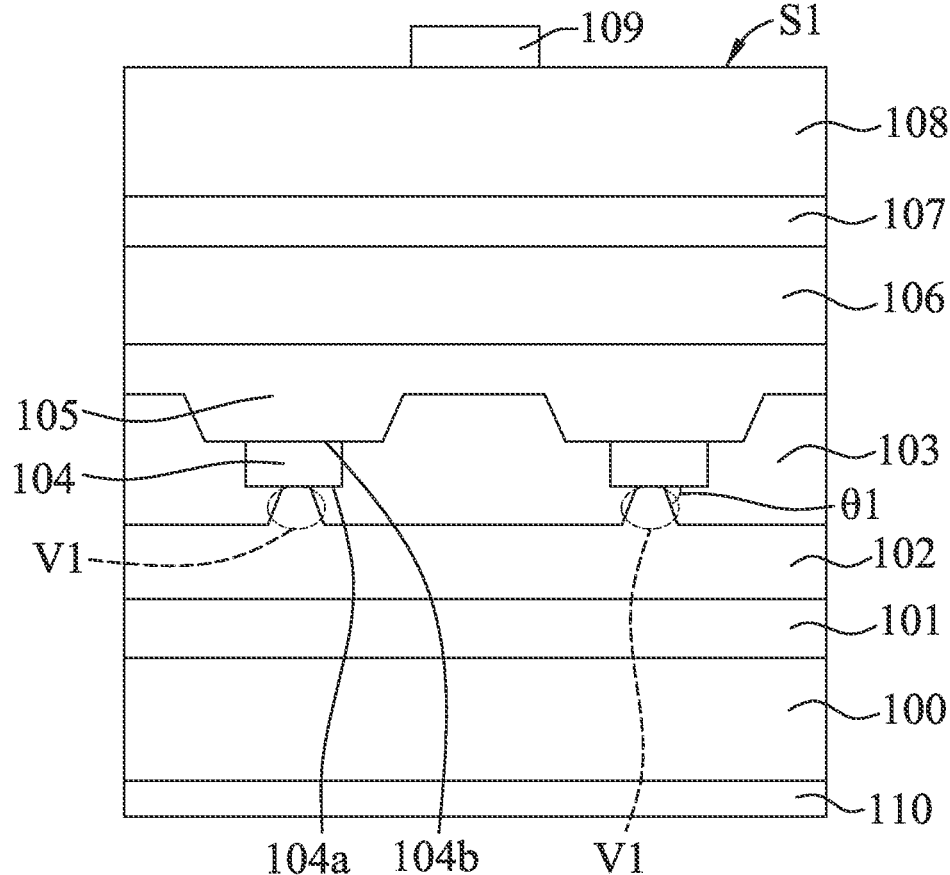
FIG. 3 is a schematic view illustrating a third embodiment of the light-emitting device according to the disclosure.

FIG. 3 illustrates a third embodiment of the light-emitting device according to this disclosure. In comparison with the second embodiment of the light-emitting device as shown in FIG. 2, in this embodiment, the area of the second contacting surface 104b of the ohmic contact layer 104 to which the non-recess regions are connected is smaller than the total area of the surfaces of the non-recess regions which contact the second contacting surface 104*b* of the ohmic contact layer 104. By further reducing the area of the second contacting surface 104*b* of the ohmic contact layer 104, the light absorption of the ohmic contact layer 104 may be further reduced, thereby enhancing the luminous brightness of the light-emitting device. This embodiment may be adapted for a product that requires a light emitting device with a relatively high luminous brightness.

In the present embodiment, the recess regions and the non-recess regions on the part of the current spreading layer 105 away from the light exiting surface may reduce the light absorption of the current spreading layer 105. Simultaneously, by virtue of the area of the second contacting surface 104*b* of the ohmic contact layer 104 being smaller than the total area of the surfaces of the non-recess regions which contact the second contacting surface 104*b* of the ohmic contact layer 104, by virtue of the formation of the recess regions and the non-recess regions, and by virtue of the area of the first contacting surface 104*a* of the ohmic contact layer 104 being greater than the total area of the openings of the through holes (V1) of the light-transmissive dielectric layer 103, the mirror reflection area is maximized and the lower voltage of the light-emitting device is ensured, thereby improving the luminous efficiency and the luminous brightness of the light-emitting device.

Figure 4:
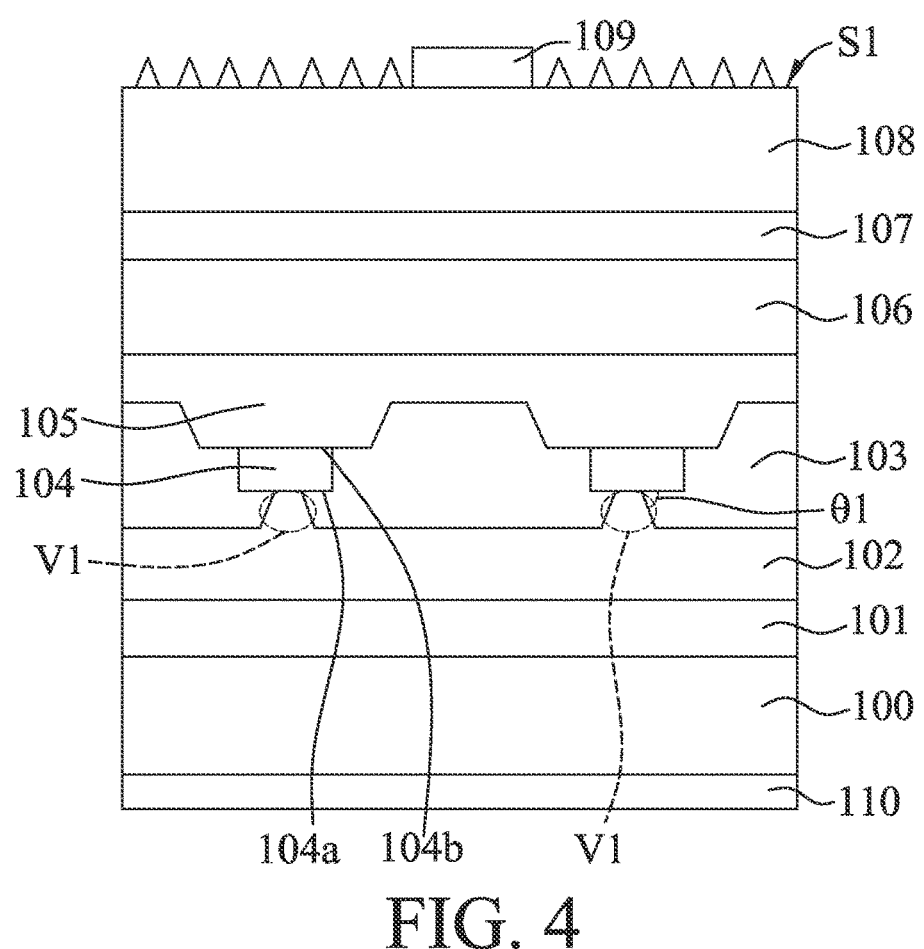
FIG. 4 is a schematic view illustrating a fourth embodiment of the light-emitting device according to the disclosure.

FIG. 4 illustrates a fourth embodiment of the light-emitting device according to this disclosure. Compared with the third embodiment of the light-emitting device as shown in FIG. 3, in order to further improve luminous efficiency of the light emitted from the active layer 107 through the light exiting surface, the first surface (S1) of the semiconductor epitaxial structure has a roughened structure. It should be noted that, the roughened structure may be applied to the aforesaid embodiments or other embodiments.

The following is a detailed description of a manufacturing method of the third embodiment of the light-emitting device.

Figure 5:
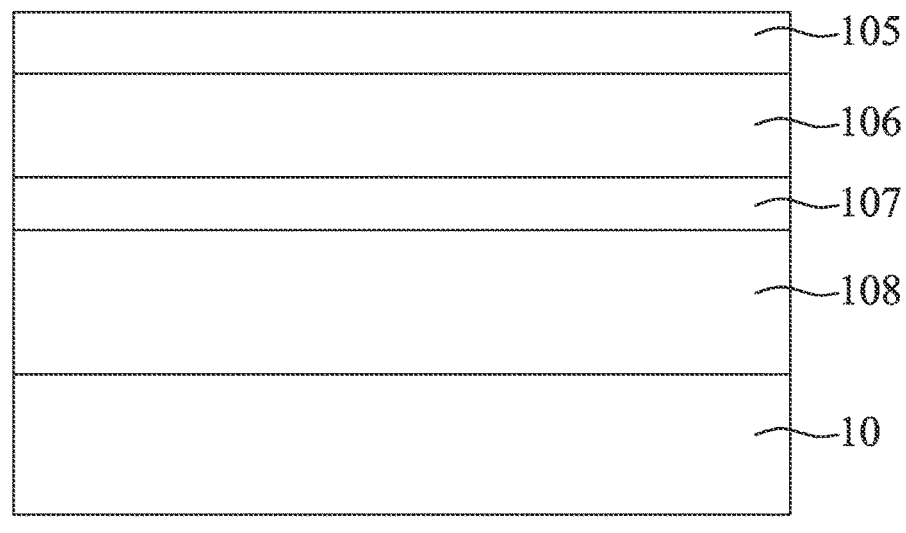
FIGS. 5 to 8 are schematic views illustrating a method for manufacturing the third embodiment of the light-emitting device according to the present disclosure.

Referring to FIG. 5, the semiconductor epitaxial structure is provided, and includes the first type semiconductor layer 108, the active layer 107, the second type semiconductor layer 106, and the current spreading layer 105.

Specifically, a growth substrate 10 is first provided and may be made of GaAs. By using an epitaxial process, such as MOCVD, the semiconductor epitaxial structure which includes the first type semiconductor layer 108, the active layer 107, the second type semiconductor layer 106 and the current spreading layer 105 is grown on the growth substrate 10. When the first type semiconductor layer 108 is an n-type doped semiconductor layer, the second type semiconductor layer 106 is a p-type doped semiconductor layer having an electrical property different from that of the first type semiconductor layer 108. Alternately, when the first type semiconductor layer 108 is a p-type doped semiconductor layer, the second type semiconductor layer 106 is an n-type doped semiconductor layer. The active layer 107 may be an intrinsic semiconductor layer, a p-type doped semiconductor layer or an n-type doped semiconductor layer. When a current is applied to the semiconductor epitaxial structure, the active layer 107 is activated to emit light. In this embodiment, each of the second type semiconductor layer 106 and the current spreading layer 105 is a p-type doped semiconductor layer. The semiconductor epitaxial structure is an AlGaInP-based semiconductor epitaxial structure or a GaAs-based semiconductor epitaxial structure, and the active layer 107 radiates red light or infrared light.

Figure 6:
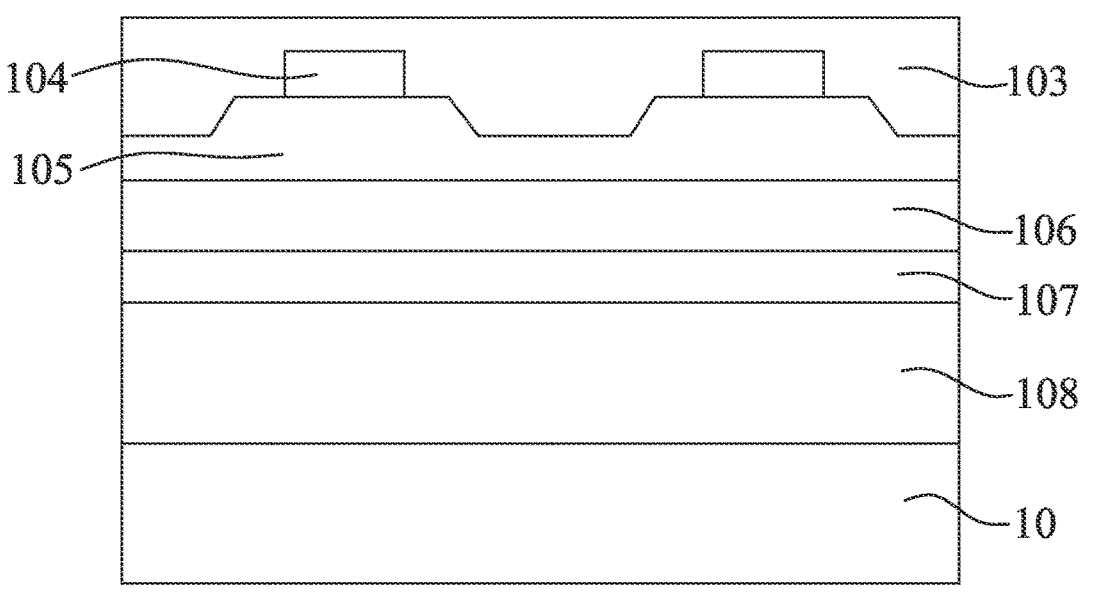

Referring to FIG. 6, the ohmic contact layer 104 is formed on the current spreading layer 105 by, e.g., physical or chemical deposition. By using a patterned photoresist formed by photolithography, and an etching procedure, the ohmic contact layer 104 is patterned. The current spreading layer 105 is then etched by a conventional etching process utilizing an inductively coupled plasma etching machine to form the recess regions and the non-recess regions. Thereafter, the light-transmissive dielectric layer 103 is formed on the recess regions, the non-recess regions of the current spreading layer 105 and the ohmic contact layer 104 by plasma-enhanced chemical vapor deposition (PECVD), atomic layer deposition (ALD), E-beam, or the like. In this embodiment, the ohmic contact layer 104 is made of ITO.

Figure 7:
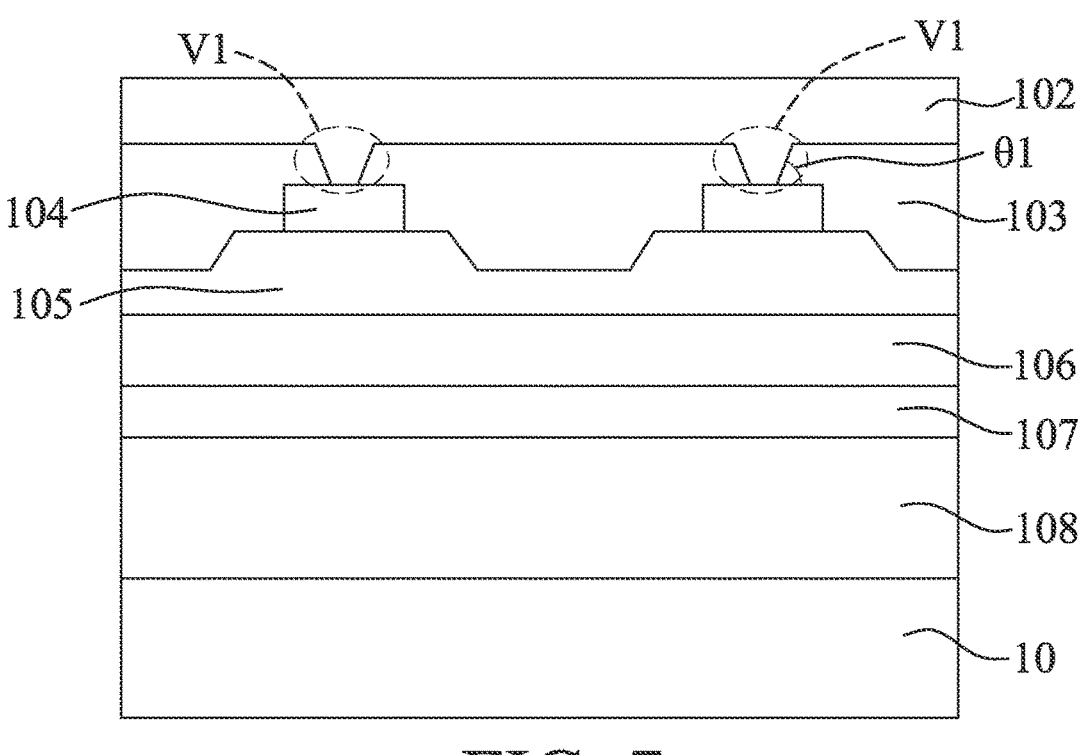

Referring to FIG. 7, by masking and etching, the plurality of through holes (V1) are formed in the light-transmissive dielectric layer 103, each being defined by the hole-defining surface of the light-transmissive dielectric layer 103. Then, the reflection layer 102 is disposed on the light-transmissive dielectric layer 103 and fills the through holes (V1) of the light-transmissive dielectric layer 103.

Figure 8:
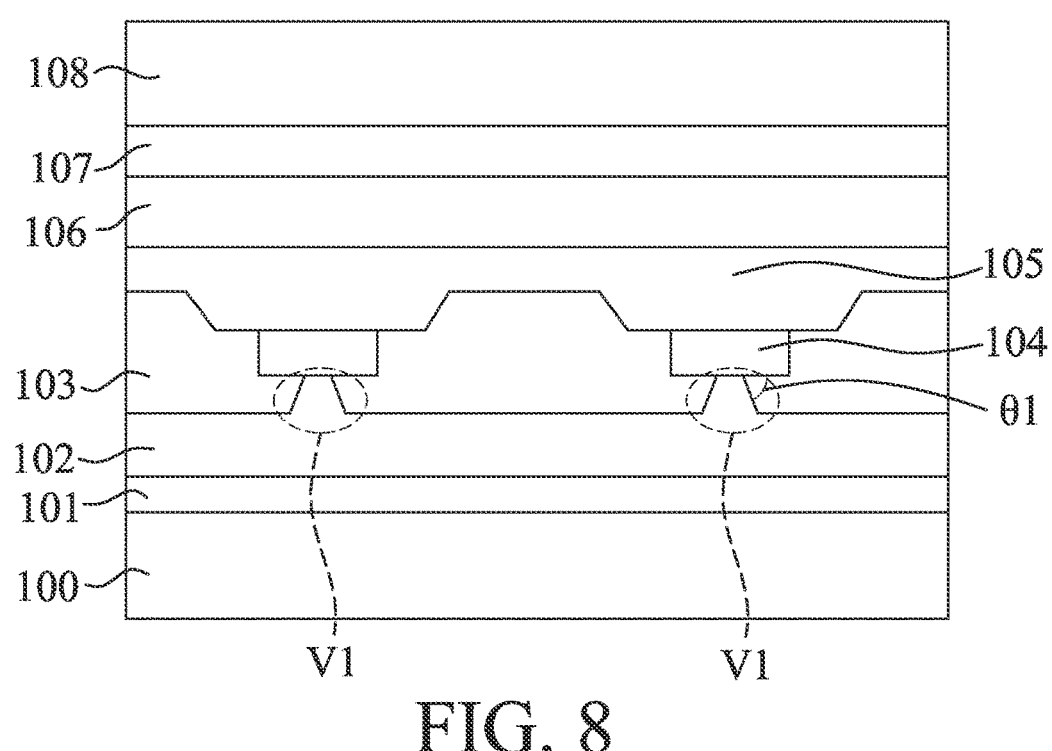

Referring to FIG. 8, the metal bonding layer 101 is disposed on the reflection layer 102 away from the light-transmissive dielectric layer 103, and bonds with the supporting substrate 100 via a bonding process. Then, the growth substrate 10 is removed by wet etching.

Finally, the first electrode 109 is formed on the first type semiconductor layer 108, and the second electrode 110 is formed on the substrate 100 away from the semiconductor epitaxial structure. The light-emitting device as shown in FIG. 3 is thus obtained.

In some embodiments, to further improve luminous efficiency of the light emitted from the active layer 107 and then exiting from the light exiting surface, the roughened structure may be formed on the first type semiconductor layer 108 away from the active layer 107 by etching so as to obtain the light-emitting device as shown in FIG. 4.

The current spreading layer 105 of the light-emitting device of the present embodiment may reduce the light absorption in a design, in which the recess regions and the non-recess regions are formed in the part of the current spreading layer 105 away from the light exiting surface. Simultaneously, since the area of the second contacting surface 104*b* of the ohmic contact layer 104 is smaller than the total area of the surfaces of the non-recess regions which contact the second contacting surface 104*b* of the ohmic contact layer 104, is greater than the total area of the openings of the through holes (V1) of the light-transmissive dielectric layer 103, and has the patterned structure, the mirror reflection area is maximized and the lower voltage of the light-emitting device is ensured, thereby improving the luminous efficiency and the luminous brightness of the light-emitting device.

Referring to FIG. 9, an embodiment of a light-emitting apparatus 300 according to the disclosure is shown, and includes a plurality of light-emitting devices 1 as described in any of the previous embodiments. The light-emitting devices 1 are arranged in an array, and a portion of the light-emitting devices 1 is enlarged and schematically shown.

In this embodiment, the light-emitting apparatus 300 may be a plant lighting device, a stage light, a projector, or a display screen.

Since the light-emitting apparatus 300 has the light-emitting devices 1 as described in any one of the previous embodiments, the light-emitting apparatus 300 has advantages of the light-emitting devices of the aforementioned embodiments.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A light-emitting device, comprising:
a semiconductor epitaxial structure that has a first surface and a second surface opposite to said first surface, and that includes:
a first type semiconductor layer,
an active layer, and
a second type semiconductor layer sequentially disposed in such order in a thickness direction from said first surface to said second surface, said first surface being a light exiting surface;
an ohmic contact layer that is disposed on said second surface of said semiconductor epitaxial structure,
a light-transmissive dielectric layer that is disposed on said ohmic contact layer away from said semiconductor epitaxial structure and that has a plurality of through holes, each of said through holes having an opening that faces said ohmic contact layer, and
a reflection layer that is disposed on said light-transmissive dielectric layer and that fills said through holes so as to be electrically connected to said ohmic contact layer;
wherein said ohmic contact layer has a first contacting surface that faces said openings of said through holes, and a second contacting surface that contacts said second surface, an area of said first contacting surface of said ohmic contact layer being greater than a total area of said openings of said through holes, an area of said second contacting surface of said ohmic contact layer accounting for 2% to 60% of an area of said second surface.

2. The light-emitting device as claimed in claim 1, wherein said area of said second contacting surface of said ohmic contact layer accounts for 4% to 40% of said area of said second surface.

3. The light-emitting device as claimed in claim 1, wherein said light-transmissive dielectric layer has a single-layered structure or a multi-layered structure.

4. The light-emitting device as claimed in claim 1, wherein said light-transmissive dielectric layer includes one of nitride, oxide, fluoride and combinations thereof.

5. The light-emitting device as claimed in claim 1, wherein a refractive index of said second type semiconductor layer is n0, and a refractive index of said light-transmissive dielectric layer is n1, where n0>n1.

6. The light-emitting device as claimed in claim 1, wherein said light-transmissive dielectric layer has a thickness greater than 1000 Å.

7. The light-emitting device as claimed in claim 1, wherein each of said through holes is defined by a hole-defining surface of said light-transmissive dielectric layer, said hole-defining surface defining each of said through holes is oblique, and forming an included angle with the imaginary plane, said included angle ranging from 20° to 80°.

8. The light-emitting device as claimed in claim 7, wherein said included angle ranges from 30° to 70°.

9. The light-emitting device as claimed in claim 1, wherein said ohmic contact layer has a patterned structure.

10. The light-emitting device as claimed in claim 9, wherein said light-transmissive dielectric layer covers a part of a surface of said ohmic contact layer away from said semiconductor epitaxial structure and a side surface of said ohmic contact layer.

11. The light-emitting device as claimed in claim 1, wherein said ohmic contact layer is a transparent conductive layer.

12. The light-emitting device as claimed in claim 11, wherein said ohmic contact layer includes one of ZnO, $In_2O_3$, $SnO_2$, ITO (Indium Tin Oxide), IZO (Indium Zinc Oxide), GZO (Gallium-doped Zinc Oxide) and combinations thereof.

13. The light-emitting device as claimed in claim 1, wherein said semiconductor epitaxial structure further includes a current spreading layer disposed on said second type semiconductor layer, and having a recess region and a non-recess region away from said first surface, said ohmic contact layer being disposed on said non-recess region, said light-transmissive dielectric layer being disposed on said non-recess region and said ohmic contact layer away from said semiconductor epitaxial structure.

14. The light-emitting device as claimed in claim 13, further comprising a reflection layer disposed on said light-transmissive dielectric layer away from said semiconductor epitaxial structure.

15. The light-emitting device as claimed in claim 13, wherein said area of said second contacting surface of said ohmic contact layer is no greater than an area of a surface of said non-recess region contacting said second contacting surface of said ohmic contact layer.

16. The light-emitting device as claimed in claim 1, wherein said light-emitting device emits a light having a wavelength that ranges from 550 nm to 950 nm.

17. A light-emitting apparatus, comprising the light-emitting device as claimed in claim 1.

\* \* \* \* \*